United States Patent [19]

Rellick

[11] Patent Number: 4,466,830

[45] Date of Patent: Aug. 21, 1984

[54] THICK FILM GOLD METALLIZATION COMPOSITION

[75] Inventor: Joseph R. Rellick, Wilmington, Del.

[73] Assignee: E. I. Du Pont de Nemours and Company, Wilmington, Del.

[21] Appl. No.: 442,955

[22] Filed: Nov. 19, 1982

[51] Int. Cl.³ .............................................. H01B 1/02
[52] U.S. Cl. .................................... 106/1.18; 252/514
[58] Field of Search ........................ 106/1.18; 252/514

[56] References Cited

U.S. PATENT DOCUMENTS

| | | | |
|---|---|---|---|
| 3,970,590 | 7/1976 | Hoffman et al. | 252/514 |
| 4,004,057 | 1/1977 | Hoffman et al. | 428/209 |
| 4,219,448 | 8/1980 | Ross | 252/514 |
| 4,230,493 | 10/1980 | Felten | 106/1.13 |
| 4,235,944 | 11/1980 | Felten | 427/125 |

*Primary Examiner*—Lorenzo B. Hayes

[57] ABSTRACT

Paste composition for electrical terminal contact metallization containing 65 to 97% by weight gold and 3 to 25% by weight cadmium/antimony alloy dispersed in an inert liquid vehicle.

4 Claims, No Drawings

THICK FILM GOLD METALLIZATION COMPOSITION

DESCRIPTION

1. Technical Field

This invention relates to thick film paste compositions. More specifically, it refers to a composition containing a mixture of fine particles of gold and an alloy of cadmium and antimony for use as a metallization on electrically conductive surfaces.

2. Background Art

Because of the high cost of gold, it is desirable to limit its use to those parts of an article where its unique combination of properties is needed. An electrical connector is one example of a device which frequently employs relatively large quantities of gold.

Manufacturers of electrical connectors use several techniques to minimize the use of gold while still maintaining high connector performance. These include use of gold cladding, selective plating, and welding or brazing of small pieces of gold to critical areas of the connector. One critical area of a connector is that of the electrical contact, but because of the small size and restricted access to this area of many connectors, the usual selective gold placement techniques are difficult to use or result in the placement of more gold than is actually needed to perform the electrical contact function. Furthermore, some processes like plating are limited in the range of gold alloys which can be deposited.

It has been suggested that a gold paste layer would offer an attractive means for selective placement of gold metallizations. See U.K. Pat. No. 2071 703A.

Screen printing of thick film paste compositions can produce fired films in the range of 0.01 to 0.04 mm thickness and as small as 0.2 to 0.5 mm diameter without much difficulty. However, available thick film gold compositions are generally intended for firing on ceramic substrates to form conductor lines, wire bonding pads or bonding pads for silicon integrated circuit chips. They do not produce functional contact metallizations when fired on metal connector substrates, because of adherence problems. A composition for connector contact metallizations must adhere well to a range of copper-base metal substrates without expensive substrate cleaning or the use of corrosive fluxes. It must produce a good electrical contact to the underlying metal and also to its mating contact surface. This latter requirement generally demands the absence of corrosion products resulting either from corrosion of parts of the metallization itself or from corrosion of the underlying substrate through pores in the metallization. Finally, it must be wear-resistant to withstand a large number of mating cycles. A need exists for such a thick film gold composition.

SUMMARY OF THE INVENTION

I have discovered specific thick film gold compositions for producing adherent, low contact resistance metallizations on metal substrates. The compositions are comprised of finely divided inorganic powder dispersed in an inert liquid vehicle. The inorganic powder comprises:

(A) 65 to 97% by weight of the inorganic solids of gold, (B) 3 to 25% by weight of the inorganic solids of cadmium/antimony (Cd/Sb) alloy, (C) 0–20% by weight of the inorganic solids of copper and (D) 0–30% by weight of the inorganic solids of silver.

The proportion of inorganic powder to vehicle is a matter of choice, depending on the desired viscosity, but normally to make a printable paste there is 60–95% by weight inorganic powder and 5–40% by weight vehicle.

DETAILED DESCRIPTION OF THE INVENTION

My compositions consist of finely divided gold particles plus finely divided particles of an alloy of cadmium and antimony (Cd/Sb) dispersed in an inert liquid vehicle. The term finely divided is taken to mean that substantially all of the solid material is present as powder particles with the largest dimension less than 10 microns. Such powders results in compositions producing smooth, well resolved prints. For uses not requiring fine resolution or for application techniques other than screen printing, such as syringe dispensing or the like, larger particles could be used. The vehicle is present only for convenience of powder placement, and other application techniques involving dispensing and placement on the substrate of a dry mixture of the powder of this invention would be equally effective. In addition to gold and a cadmium/antimony alloy, copper or silver powder or alloys thereof may be present in the composition.

The gold in the composition should comprise between 65 and 97% by weight of inorganic solids and preferably 75 to 95% and more preferably between 80 and 90%. Too low a gold content results in a deterioration of corrosion resistance. Corrosion resistance in gold alloys is generally good as long as the atomic percent gold is 50% or greater but declines sharply below 50%.

The Cd/Sb should comprise between 3 and 25% by weight of inorganic solids and preferably between 5 and 20%, and more preferably between 7 and 15%. The cadmium/antimony alloy is made by melting together the desired amounts of cadmium and antimony in a refractory crucible in a nitrogen atmosphere to form a homogeneous liquid alloy. The liquid alloy is allowed to solidify and the resultant ingot is comminuted to a fine powder. Alternatively, the fine alloy powder could be produced by atomization of the homogeneous liquid alloy.

The antimony content of the cadmium/antimony alloy is 25 percent to 80 percent by weight and preferably 40 percent to 75 percent and more preferably 45–65 percent.

During firing of the printed compositions on a metal substrate, the Cd/Sb melts early in the firing cycle at about 350° C.–550° C. and as the temperature is raised further, the gold, copper or silver dissolves into the liquid forming an alloy among the constituents and resulting in a well sintered, coherent metallization. The liquid phase wets the metal substrate and partially dissolves the topmost substrate layer resulting in good adhesion and electrical contact to the substrate. Since some of the substrate is dissolved, the composition of the metallization after firing is not precisely the same as its composition before firing. The extent of this pickup of substrate constituents varies with the chemical composition of the substrate and the thickness of the metallization as well as the nature of the heating cycle. In general, substrate interaction can be minimized by use of relatively high melting substrates such as cupronickel, or by use of substrates coated with a higher melting metal such as nickel. Rapid heating to the sintering temperature also aids in preventing melting of the substrate and the resulting sinking in of the metallization.

If the Cd/Sb content of the metallization is excessively high, substrate melting becomes excessive and the liquid phase formed early in the firing cycle flows out beyond the confines of the original printed area. Too low Cd/Sb content results in inadequate sintering and adhesion to the substrate. Those skilled in the art will see that the amount of Cd/Sb to be used must be adjusted depending on the heating cycle and the metal substrate used.

Copper or silver powder may be used in these compositions to reduce the cost, improve the mechanical properties such as hardness, or alter the color of the fired metallization. The amount of these more corrosion susceptible elements which can be used in the compositions depends on the degree of corrosion resistance desired and the amount of pickup of base metal constituents from the substrate. Up to 20% copper and up to 30% of silver by weight of inorganic solids may be used for some applications, while for applications with more exacting corrosion requirements, a limit of 15% of silver or copper would be appropriate. The addition of small amounts of other metals which do not alter the beneficial properties of these metallizations is permissible. In particular, it is believed that platinum or palladium could be added without loss of corrosion resistance.

The vehicle used in the thick film gold conductor compositions of the present invention can be any of those generally used in conventional gold conductor compositions including solutions or dispersions of resins, such as ethyl cellulose resin, polybutyl methacrylate, poly-α-methyl styrene or poly(ethylene vinyl acetate). Suitable solvents or dispersing mediums must be physically compatible with the resin and the resulting solution or dispersion must be chemically inert with respect to the other components of the gold metallization composition. Any one of various organic liquids, with or without thickening and/or stabilizing agents and/or other common additives (e.g., thixotropes and wetting agents) can be used as the carrier for the organic resin. Suitable organic liquids include aliphatic alcohols (e.g., 1-decanol), esters of such alcohols (e.g., acetates or propionates), glycol ethers (e.g., dibutyl carbitol), terpines (e.g., pine oil or terpineol), and di-alkyl phthalates (e.g., di-butyl phthalate or di-methyl phthalate). Preferred thixotropes include hydrogenated castor oil. Preferred wetting agents include soya lecithin, triethanolamine, and tributyl phosphate. Stabilizers can be added to prevent oxidation and degradation by acid by-products, i.e., to stabilize viscosity or to help buffer the pH. Examples of suitable stabilizers include triethanolamine and 2,6-di-t-butyl-4-methyl phenol (e.g., Shell Ionol ®).

The Examples below where all percents are by weight further illustrate my invention.

EXAMPLE I 54.0 g of Fisher Cat. No. A846 lump antimony and 46.2 g of Alfa Cat. No. 00669 cadmium shot were melted together in a nitrogen atmosphere by heating to 650° C. in an alumina crucible. The resultant ingot was comminuted to a particle size less than 400 mesh. Two grams of the Cd/Sb powder were mixed with 18 grams of a gold powder in which substantially all of the gold is between 0.1 micron and 5 microns in size. A quantity of vehicle weighing about 1.6 grams was added to make a smooth, well dispersed paste. The vehicle composition was 5.2% ethyl cellulose, 11.6% terpineol, 52.8% dibutyl phthalate, and 30.4% dibutyl carbitol. The resultant paste was printed as thick film through a patterned 200 mesh stainless steel screen onto a piece of cold rolled CDA alloy 725 cupro-nickel and fired in a nitrogen atmosphere conveyor furnace to a peak temperature of 650° C. with 5 minutes at peak and total cycle time of 45 minutes. After firing, the gold alloy metallization was well adhered to the cupro-nickel substrate as determined by burnishing with a pencil eraser, probing with a sharp implement, and bending the substrate around a ⅛" diameter mandrel. Another sample not so tested was placed in a sealed desiccator containing concentrated nitric acid and exposed to the vapors but not the liquid for one hour at room temperature. Following the exposure, the sample was inspected under 30× magnification for any evidence of corrosion within the gold pad area. None was observed. The electrical resistance between the pad and the substrate was measured with a sensitive ohmmeter. No measurable contact resistance was found, indicating excellent electrical contact between metallization and substrate.

Showing A

A paste of 20 grams of the gold powder and 0.7 gram of vehicle was printed and fired as in Example I. After firing, the metallization was observed to be crumbly, porous and not well adhered to the cupro-nickel substrate, demonstrating the efficacy of Cd/Sb additions.

EXAMPLE II

Seven and one-half grams of the gold and 0.5 gram of the Cd/Sb of Example I were mixed with 2.0 grams of copper powder having substantially all of the material between 0.1 micron and 10 microns in diameter. The powders were blended with 0.8 gram of the vehicle of Example I to form a smooth, well dispersed paste and then printed and fired as described above. After firing, the metallizations were found to be well adhered, corrosion resistant, and in good electrical contact with the substrate.

EXAMPLE III

A gold paste containing cadmium/antimony alloy was prepared in accordance with the procedures set forth in Example I.

The resultant paste was printed as a thick film dot 0.8 mm in diameter through a patterned 325 mesh stainless steel screen onto a continuous strip of prepunched CDA725 cupro-nickel alloy. The printed portion was positioned under a focused induction heating coil. The assembly was blanketed with nitrogen to eliminate oxidation during the firing process. Energy was applied for 1.0 sec. and the dot was melted and securely adhered onto the substrate. At 0.8 sec., the dot still had a sintered structure, while at 1.6 sec., the dot sank deeply into the substrate and unacceptably deformed the substrate. At 1.0 sec., some substrate was annealed directly below the melted dot. Afterward the strip was made into an electrical terminal and tested. It performed better than a welded gold dot product, and as well or better than a gold plated product. The process was also used for 75%, Au, 15% Cu and 10% Cd/Sb composition, with similar melting performance.

Having thus described the invention, what is claimed and desired to be secured by Letters Patent is:

1. Thick film gold composition suitable for electrical terminal contact metallization comprising:
   65 to 97% by weight of gold particles,
   3 to 25% by weight of particles of an alloy of cadmium and antimony having an antimony content of 25–80% by weight,
   0–20% by weight copper particles and
   0–30% by weight silver particles, the weights based on the total inorganic solids present, the solids being dispersed in a vehicle in a concentration sufficient to make a printable paste.

2. A composition according to claim 1 wherein the gold particle content is 75 to 95% by weight and the cadmium/antimony content is 5 to 20% by weight.

3. A composition according to claim 1 wherein the gold particle content is 80 to 90% by weight and the cadmium/antimony content is 7 to 15% by weight.

4. A screen-printable paste comprising 60–95% by weight of the inorganic solids of claim 1 and 5 to 40% by weight of the vehicle.

* * * * *